United States Patent
Ichiki et al.

(10) Patent No.: US 10,198,132 B2
(45) Date of Patent: Feb. 5, 2019

(54) ELECTROCONDUCTIVE FILM AND METHOD FOR MANUFACTURING SAME

(71) Applicant: FUJIFILM Corporation, Tokyo (JP)

(72) Inventors: Akira Ichiki, Kanagawa-ken (JP); Nozomu Tonoike, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 422 days.

(21) Appl. No.: 15/054,968

(22) Filed: Feb. 26, 2016

(65) Prior Publication Data

US 2016/0253002 A1    Sep. 1, 2016

Related U.S. Application Data

(63) Continuation of application No. PCT/JP2014/071358, filed on Aug. 13, 2014.

(30) Foreign Application Priority Data

Aug. 30, 2013  (JP) ................................. 2013-180644

(51) Int. Cl.
| | | |
|---|---|---|
| G06F 3/044 | (2006.01) | |
| G03F 7/16 | (2006.01) | |
| G03F 7/20 | (2006.01) | |
| G03F 7/32 | (2006.01) | |

(Continued)

(52) U.S. Cl.
CPC ............. G06F 3/044 (2013.01); G03F 7/06 (2013.01); G03F 7/16 (2013.01); G03F 7/20 (2013.01); G03F 7/32 (2013.01); G06F 3/047 (2013.01); *G06F 2203/04103* (2013.01); *G06F 2203/04112* (2013.01)

(58) Field of Classification Search
CPC .................................. G06F 3/044; G06F 3/047
USPC .......................................................... 174/250
See application file for complete search history.

(56) References Cited

U.S. PATENT DOCUMENTS

| | | | |
|---|---|---|---|
| 2010/0300729 A1 | 12/2010 | Matsuda et al. | |
| 2011/0089160 A1* | 4/2011 | Kuriki .................. | H05B 3/84 219/553 |

(Continued)

FOREIGN PATENT DOCUMENTS

| | | | |
|---|---|---|---|
| JP | 2009-086327 A | 4/2009 | |
| JP | 2009-252868 A | 10/2009 | |

(Continued)

OTHER PUBLICATIONS

An Office Action; "Notification of Reasons for Refusal" issued by the Japanese Patent Office on May 10, 2016, which corresponds to Japanese Patent Application No. 2013-180644 and is related U.S. Appl. No. 15/054,968; with English language translation.

(Continued)

*Primary Examiner* — Sherman Ng
(74) *Attorney, Agent, or Firm* — Studebaker & Brackett PC

(57) ABSTRACT

An electroconductive film and a method for manufacturing the electroconductive film, having an insulating substrate and an electrode including a thin metal wire disposed on the surface of the insulating substrate, wherein the width of the thin metal wire varies, the difference between the maximum wire width and the minimum wire width of the thin metal wire is 20% to less than 75% of the average wire width of the thin metal wire, and the average wire width is 1-7 µm.

7 Claims, 10 Drawing Sheets

(51) Int. Cl.
G06F 3/047 (2006.01)
G03F 7/06 (2006.01)

(56) References Cited

U.S. PATENT DOCUMENTS

2011/0308846 A1* 12/2011 Ichiki .................... G06F 3/044
                                                              174/257
2012/0312677 A1* 12/2012 Kuriki .................... G06F 3/044
                                                              200/600
2014/0098307 A1    4/2014 Iwami

FOREIGN PATENT DOCUMENTS

| JP | 2010-276998 A | 12/2010 |
| JP | 2011-054382 A | 3/2011 |
| JP | 2012-074206 A | 4/2012 |
| WO | 2013/008827 A1 | 1/2013 |

OTHER PUBLICATIONS

International Search Report issued in PCT/JP2014/071358; dated Nov. 18, 2014.
Written Opinion issued in PCT/JP2014/071358; dated Nov. 18, 2014.

* cited by examiner

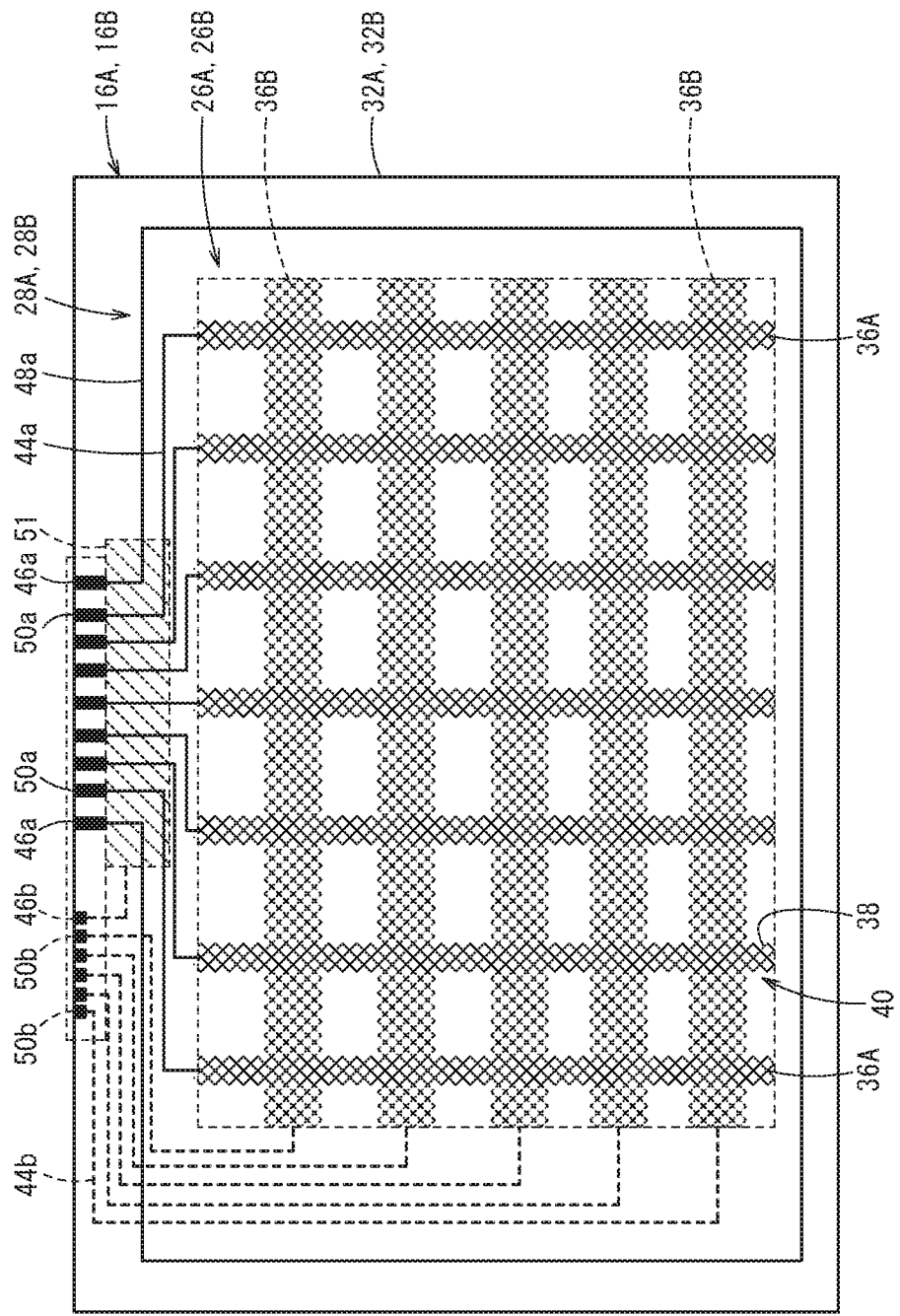
F I G. 3

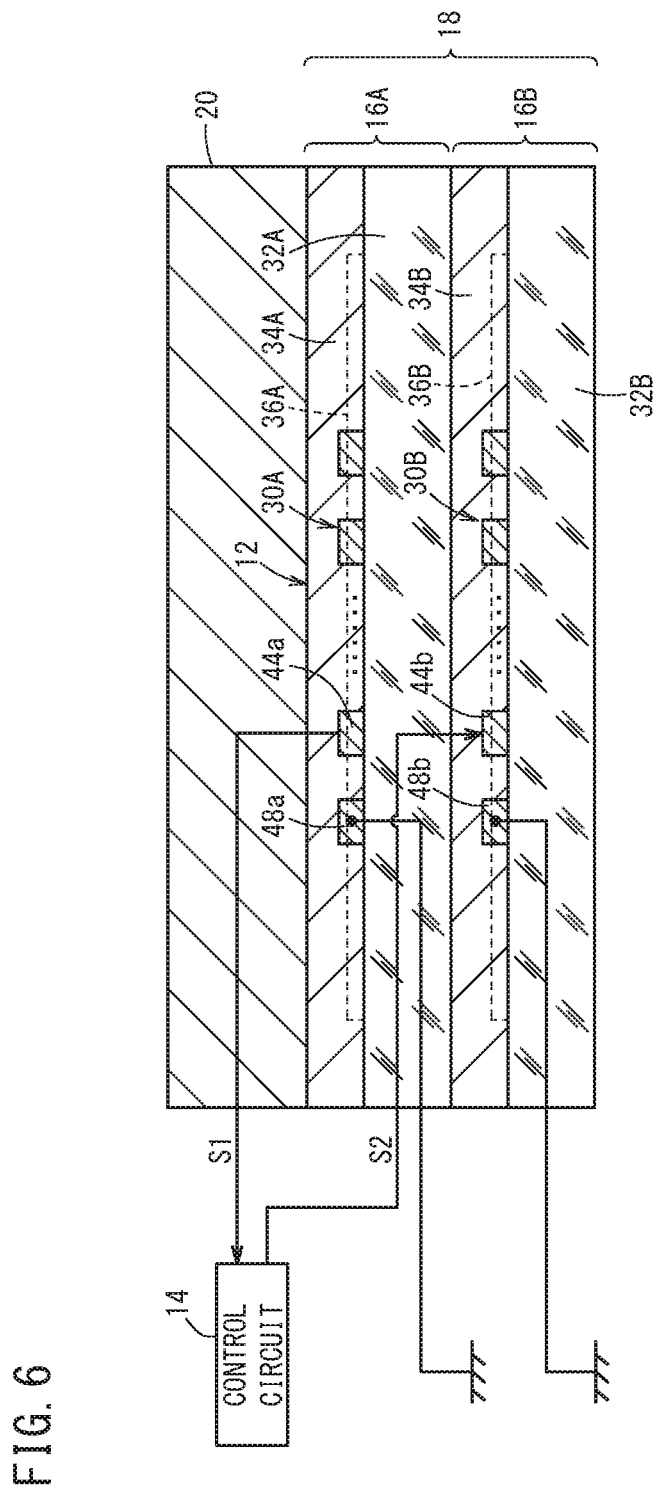

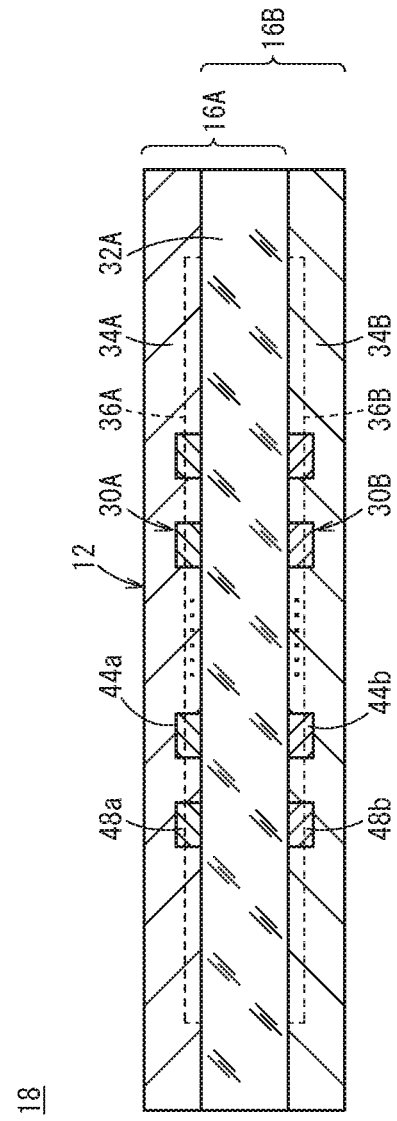

ELECTROCONDUCTIVE FILM AND
METHOD FOR MANUFACTURING SAME

CROSS-REFERENCE TO RELATED
APPLICATIONS AND PRIORITY CLAIM

This application is a Continuation of International Application No. PCT/JP2014/071358 filed on Aug. 13, 2014 which was published under PCT Article 21(2) in Japanese, which is based upon and claims the benefit of priority from Japanese Patent Application No. 2013-180644 filed on Aug. 30, 2013, the contents all of which are incorporated herein by reference.

TECHNICAL FIELD

The present invention relates to an electroconductive film and a method of manufacturing same, and more particularly to an electroconductive film suitable for use in a touch panel or the like, for example, and a method of manufacturing same.

BACKGROUND ART

Recently, it has been proposed to use an electroconductive film with a mesh pattern formed thereon of thin metal wires as an electromagnetic-wave shield film (see Japanese Laid-Open Patent Publication No. 2009-252868 and Japanese Laid-Open Patent Publication No. 2010-276998).

Japanese Laid-Open Patent Publication No. 2009-252868 describes that a mesh-shaped electroconductive layer is formed with varying mesh line widths on a transparent substrate by gravure printing. For example, it is stated that mesh line widths are formed alternately in maximum and minimum values in at least some mesh region. The electroconductive film is described as being able to provide a light-transmitting electromagnetic-wave shield material that has an excellent electromagnetic-wave shielding capability and is almost free of the generation of moire.

Japanese Laid-Open Patent Publication No. 2010-276998 describes that a photosensitive material is subjected to proximity exposure through a photomask that is spaced by a proximity gap in the range from 70 to 200 μm, fabricating a mesh pattern of thin metal wires. In particular, it describes that bulging portions that bulge toward openings are randomly formed on the sides of thin metal wires between crossings for thereby suppressing moire.

SUMMARY OF INVENTION

The electroconductive film disclosed in Japanese Laid-Open Patent Publication No. 2009-252868 is expected to achieve a further moire improvement (an effect to suppress moire) by increasing the difference between the maximum and minimum values of the line widths of the mesh pattern. However, it has a defect in that thin metal wires tend to start breaking from the portions with the minimum line width, making it impossible to realize (manufacture) an electroconductive film. According to the embodiment disclosed in Japanese Laid-Open Patent Publication No. 2009-252868, the average line width is 20 μm and the difference between the maximum and minimum values is 2 μm. If the line widths are further reduced for use in touch panels, for example (if the average line width is assumed to be 7 μm, for example), then gravure printing suffers difficulty in realizing variations of line widths.

The electroconductive film disclosed in Japanese Laid-Open Patent Publication No. 2010-276998 has the bulging portions randomly formed by exposure through the photomask spaced by the proximity gap. However, since light that has passed through the slits of the mask spreads, it is difficult to reduce the line widths of the thin metal wires. The random formation of bulging portions with thin metal wires having an average line width of 7 μm or less, for example, and the effect of improving moire with such bulging portions have not been confirmed.

The present invention has been made in view of the above problems. It is an object of the present invention to provide an electroconductive film which is capable of accomplishing the following advantages (1) through (3) and a method of manufacturing same:

(1) High transparency can be achieved even if electrodes on touch panels or the like, for example, are constructed of a pattern of thin metal wires.

(2) The generation of moire can be suppressed.

(3) An increase in the yield can be ensured.

[1] According to a first invention, there is provided an electroconductive film comprising an insulating substrate and an electrode made up of thin metal wires disposed on a surface of the insulating substrate, wherein the thin metal wires have varying line widths, the difference between maximum and minimum values of the line widths is equal to or greater than 20% and smaller than 75% of an average line width of the thin metal wires, and the average line width is equal to or greater than 1 μm and equal to or smaller than 7 μm.

[2] The average line width should preferably be equal to or greater than 2 μm and equal to or smaller than 7 μm.

[3] The average line width should more preferably be equal to or greater than 2 μm and equal to or smaller than 5 μm.

[4] In the first invention, the electrode may have a mesh pattern made of the thin metal wires.

[5] In a case where one of the thin metal wires of the mesh pattern is broken, a change in the electric resistance of the electrodes is equal to or smaller than 5%.

[6] In the first invention, the electroconductive film satisfies R2/R1<10, wherein a surface resistance of the electrode before a bend test is denoted by R1 and a surface resistance of the electrode after the bend test is denoted by R2.

[In the bend test, the electroconductive film is trained around a roller having a diameter of 4 mm which is rotatably mounted on a base, and a process of rotating the roller while one end of the electroconductive film is being pulled under a tension of 28.6 kg per width of 1 m, to bend the electroconductive film, and a process of rotating the roller while the other end of the electroconductive film is being pulled under a tension of 28.6 kg per width of 1 m, to bend the electroconductive film, are repeated to bend the electroconductive film 100 times.]

[7] The electroconductive film should preferably satisfy R2/R1≤4.

[8] In the first invention, the electrode made up of the thin metal wires is disposed on a face side of the insulating substrate, and another electrode made up of thin metal wires is disposed on a reverse side of the insulating substrate.

[9] According to a second invention, there is provided a method of manufacturing an electroconductive film comprising an insulating substrate and an electrode made up of thin metal wires disposed on a surface of the insulating substrate, comprising the step of forming at least one silver halide emulsion layer on a surface of the insulating substrate, the exposure step of exposing the silver halide emulsion layer to light, and the development step of developing the silver halide emulsion layer which has been exposed to light, wherein the thin metal wires have varying line widths, the difference between maximum and minimum values of the line widths is equal to or greater than 20% and smaller than 75% of an average line width of the thin metal wires, and the average line width is equal to or greater than 1 μm and equal to or smaller than 7 μm.

[10] The amount of coated silver of the silver halide emulsion layer is equal to or greater than 5 g/m$^2$ and equal to or smaller than 30 g/m$^2$.

[11] In the second invention, the exposure step exposes the silver halide emulsion layer to light through a glass mask held in intimate contact therewith, and the glass mask comprises a glass mask with a roughened surface.

[12] The exposure step may employ light having composite wavelengths including wavelength components shorter than 500 nm.

With the electroconductive film and the method of manufacturing same according to the present invention, even in the case where the electrodes of a touch panel or the like, for example, are constructed of the mesh pattern of the thin metal wires, the electroconductive film can achieve high transparency, can suppress the generation of moire, and can increase the yield.

BRIEF DESCRIPTION OF DRAWINGS

FIG. 3 is a plan view of essential portions, as viewed from above, of a first electroconductive film and a second electroconductive film;

FIG. 6 is a view illustrating an example of a cross-sectional structure of a laminated electroconductive film and an example of a control system (mutual-capacitance type);

FIG. 7 is a view illustrating another example of a cross-sectional structure of a laminated electroconductive film;

DESCRIPTION OF EMBODIMENTS

An embodiment wherein an electroconductive film according to the present invention is applied to a touch panel, for example, will be described below with reference to FIGS. 1 through 10B. The symbol "-" used to represent numerical ranges in the description below shall be interpreted as including numerical values that represent the upper and lower limits of the numerical ranges. In the present description, electrode patterns of a substantially rectangular shape are employed. However, electrode shapes are not limited to such a shape, but the present invention is also applicable to a pattern wherein electrodes are constructed as a combination of lozenge shapes.

Figure 1:
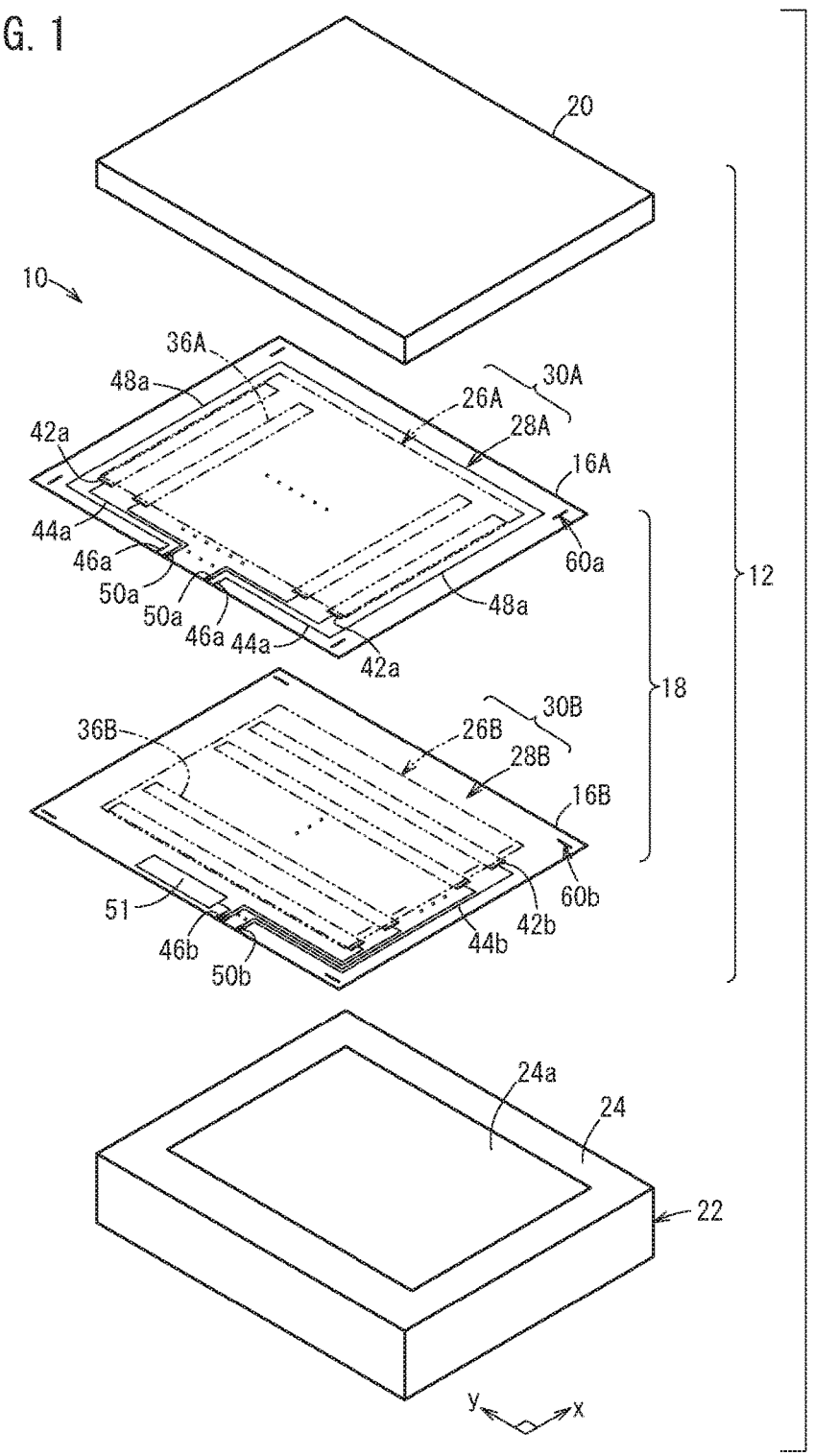
FIG. 1 is an exploded perspective view showing a structural example of an electroconductive film according to an embodiment of the present invention, as applied to a touch panel.
Figure 2:
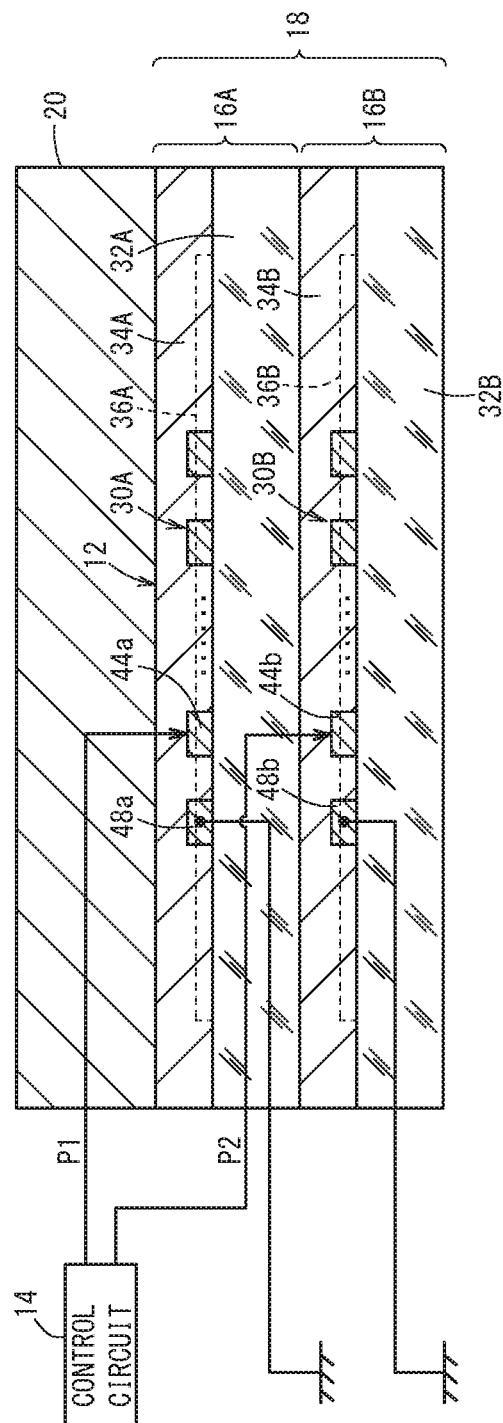
FIG. 2 is a view illustrating an example of a cross-sectional structure of a laminated electroconductive film and an example of a control system (self-capacitance type)

As shown in FIG. 1, a touch panel 10, to which an electroconductive film according to the present embodiment is applied, has a main sensor assembly 12 and a control circuit 14 (IC or the like: see FIG. 2). The main sensor assembly 12 includes a laminated electroconductive film assembly 18 made up of a first electroconductive film 16A (interconnect board) and a second electroconductive film 16B (interconnect board) that are stacked together, and a cover layer 20 made of glass, for example, stacked on the laminated electroconductive film assembly 18. The laminated electroconductive film assembly 18 and the cover layer 20 are disposed on a display panel 24 of a display such as a liquid crystal display or the like, for example. The first electroconductive film 16A and the second electroconductive film 16B as viewed from above have a first sensor area 26A and a second sensor area 26B positioned in alignment with a display screen 24a of the display panel 24, and a first terminal interconnect area 28A and a second terminal interconnect area 28B disposed in alignment with an outer peripheral region of the display panel 24 (so-called frames).

As shown in FIG. 2, the first electroconductive film 16A has a first transparent substrate 32A, a first electroconductive section 30A formed on the surface of the first transparent substrate 32A, and a first transparent adhesive layer 34A formed in covering relation to the first electroconductive section 30A.

As shown in FIGS. 1 and 3, the first sensor area 26A includes a plurality of first electrodes 36A as a transparent electroconductive layer having thin metal wires. The first electrodes 36A each have a strip-like mesh pattern 40 (see FIG. 3) comprising a number of grids 38 combined together (see FIG. 3), and extend in a first direction (x direction) and are arrayed in a second direction (y direction) perpendicular to the first direction.

On the first electroconductive film 16A arranged as described above, first terminal interconnects 44a as metal interconnects are electrically connected to respective one ends of the first electrodes 36A by respective first junctions 42a.

Specifically, as shown in FIG. 3, the first electroconductive film 16A that is applied to the touch panel 10 has a number of first electrodes 36A, referred to above, arrayed in a portion corresponding to the first sensor area 26A and the plurality of first terminal interconnects 44a arrayed in the first terminal interconnect area 28A and extending from the respective first junctions 42a. As shown in FIG. 1, a first ground line 48a that serves the purpose of providing a shield effect is formed outside of the first terminal interconnects 44a in surrounding relation to the first sensor area 26A from a first ground terminal 46a to another first ground terminal 46a.

In the example shown in FIG. 1, the outer shape of the first electroconductive film 16A is rectangular as seen in plan, whereas the outer shape of the first sensor area 26A is also rectangular. The first terminal interconnect area 28A includes, on a peripheral edge of one longer side of the first electroconductive film 16A, a plurality of first terminals 50a arrayed along the longitudinal direction of the longer side in a central region along the longitudinal direction, in addition to the above pair of first ground terminals 46a. The plurality of first junctions 42a are linearly arrayed along the longer side of the first sensor area 26A (the longer side closest to the longer side of the first electroconductive film 16A: y direction). The first terminal interconnects 44a that extend from the respective first junctions 42a extend tortuously toward a substantially central region of the longer side of the first electroconductive film 16A and are electrically connected to the corresponding first terminals 50a.

As shown in FIG. 2, the second electroconductive film 16B has a second transparent substrate 32B, a second electroconductive section 30B formed on the surface of the second transparent substrate 32B, and a second transparent adhesive layer 34B formed in covering relation to the second electroconductive section 30B.

As shown in FIGS. 1 and 3, as is the case with the first electroconductive film 16A, the second sensor area 26B has a plurality of second electrodes 36B as a transparent electroconductive layer comprising thin metal wires. As is the case with the first electrodes 36A, the second electrodes 36B each have a strip-like mesh pattern 40 comprising a number of grids 38 combined together, and extend in a second direction (y direction) and are arrayed in the first (x direction).

On the second electroconductive film 16B arranged as described above, second terminal interconnects 44b as metal interconnects are electrically connected to respective one ends of the second electrodes 36B via second junctions 42b. An electrode film 51 is formed in the second terminal interconnect area 28B at a position corresponding to the first terminal interconnects 44a of the first electroconductive film 16A, and is electrically connected to the second ground terminal 46b.

Figure 4:
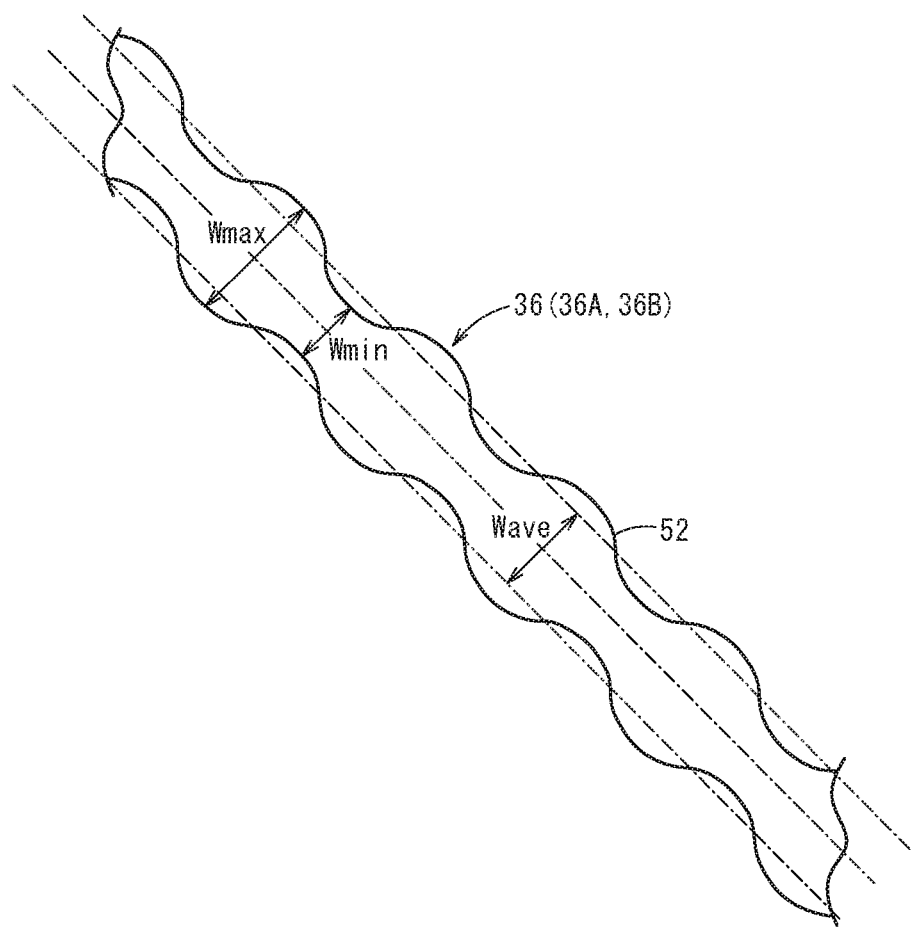
FIG. 4 is a plan view, partly omitted from illustration, of a thin metal wire with varying line widths.

With the electroconductive film according to the present embodiment, as shown in FIG. 4, the line width of each thin metal wire 52 in the first electrodes 36A and the second electrodes 36B is varying. Specifically, the difference (Wmax−Wmin) between the maximum line width Wmax and the minimum line width Wmin of the thin metal wire 52 is greater than 20% of an average line width Wave of the thin metal wire 52 and smaller than 75% of the average line width Wave, and the average line width Wave of the thin metal wire 52 is equal to or smaller than 7 μm.

In the case where the first electrodes 36A and the second electrodes 36B of the touch panel 10 are constructed of thin metal wires 52, the electroconductive film can achieve high transparency, can suppress the generation of moire, and can increase the yield.

According to a further preferred aspect, the average line width Wave of the thin metal wire 52 should preferably be equal to or greater than 2 μm and equal to or smaller than 7 μm, and more preferably be equal to or greater than 2 μm and smaller than 5 μm.

The first electrodes 36A and the second electrodes 36B should preferably include two or more thin metal wires 52 with respect to one thin metal wire 52 that exist along a direction perpendicular to the direction along which that one thin metal wire 52 extends. The first electrodes 36A and the second electrodes 36B should preferably have a mesh pattern 40 made up of a plurality of thin metal wires 52.

In the event that one of the thin metal wires 52 which make up the mesh pattern 40 is broken, any change in the electric resistance of each of the first electrodes 36A and the second electrodes 36B should preferably stay within 5%.

Furthermore, the first electroconductive film 16A and the second electroconductive film 16B (collectively referred to as "electroconductive films 16") have the following features: It is assumed that the surface resistance of the first electrodes 36A and the second electrodes 36B (collectively referred to as "electrodes 36") before a bend test is denoted by R1, and the surface resistance thereof after the bend test is denoted by R2. It is preferable to satisfy R2/R1<10 and more preferable to satisfy R2/R1≤4.

Figure 5:
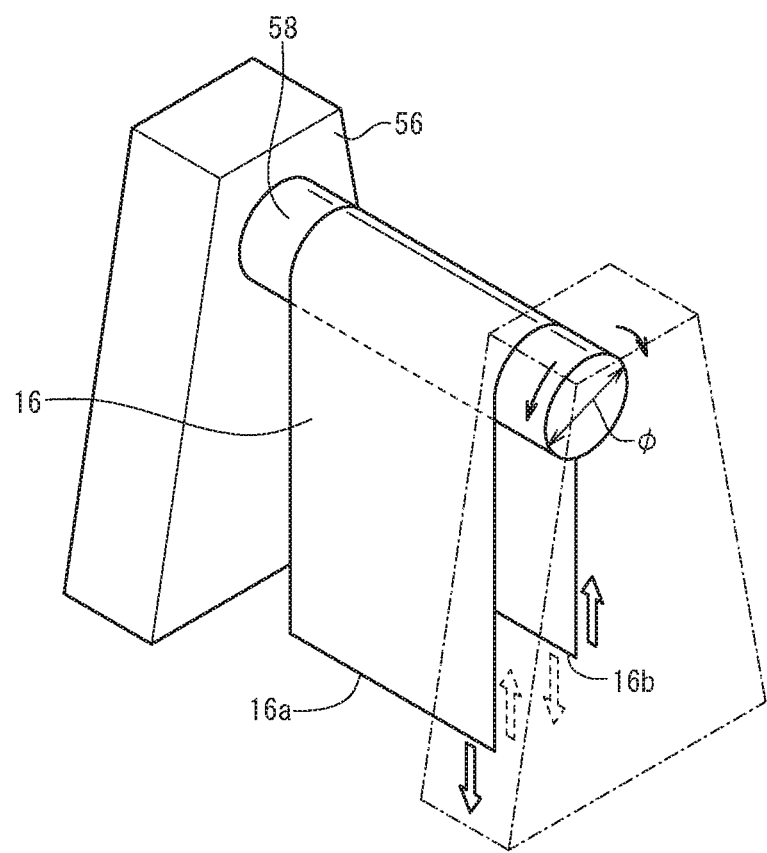
FIG. 5 is a perspective view showing an example of an apparatus used in a bend test.

In the bend test, a first process and a second process are repeatedly carried out to bend an electroconductive film 100 times. In the first process, as shown in FIG. 5, for example, an elongate electroconductive film 16 is trained around a roller 58 having a diameter φ of 4 mm which is rotatably mounted on a base 56. While one end 16a of the electroconductive film 16 is being pulled under a tension of 28.6 (kg/m), the roller 58 is rotated to bend the electroconductive film 16. In the second process, while the other end 16b of the electroconductive film 16 is being pulled under the same tension of 28.6 (kg/m), the roller 58 is rotated to bend the electroconductive film 16.

If this electroconductive film 16 is to be used as a touch panel 10, then the cover layer 20 is stacked on the first electroconductive film 16A. The first terminal interconnects 44a that extend from a number of first electrodes 36A of the first electroconductive film 16A and the second terminal interconnects 44b that extend from a number of second electrodes 36B of the second electroconductive film 16B are connected to the control circuit 14 (see FIG. 2), which controls a scanning process, for example.

A system for detecting a touched position may preferably be a self-capacitance system or a mutual capacitance system.

According to the self-capacitance system, as shown in FIG. 2, the control circuit 14 supplies a first pulse signal P1 for detecting a touched position sequentially to the first terminal interconnects 44a, and supplies a second pulse signal P2 for detecting a touched position sequentially to the second terminal interconnects 44b.

In a case where a fingertip is brought into contact with or in the vicinity of the upper surface of the cover layer 20, the capacitance between the first electrode 36A and the second electrode 36B which face the touched position and GND (ground) increases. Therefore, the waveform of a signal transmitted from the first electrode 36A and the second electrode 36B becomes different from the waveforms of signals transmitted from the other electrodes. Consequently, the control circuit 14 calculates the touched position on the basis of the transmitted signals supplied from the first electrodes 36A and the second electrodes 36B.

According to the mutual capacitance system, as shown in FIG. 6, the control circuit 14 applies a voltage signal S2 for detecting a touched position sequentially to the second electrodes 36B, and performs a sensing process (to detect a transmitted signal S1) sequentially on the first electrodes 36A. In a case where a fingertip is brought into contact with or in the vicinity of the upper surface of the cover layer 20, the stray capacitance of the finger is added parallel to the parasitic capacitance between the first electrode 36A and the second electrode 36B which face the touched position. Therefore, the waveform of the transmitted signal S1 from the second electrode 36B becomes different from the waveforms of the transmitted signals S1 from the other second electrodes 36B. Consequently, the control circuit 14 calculates the touched position on the basis of the sequence of the second electrodes 36B to which the voltage signal S2 is supplied and the transmitted signals S1 supplied from the first electrodes 36A.

According to the self-capacitance or mutual capacitance system for detecting a touched position, even in a case where two fingertips are simultaneously brought into contact with or in the vicinity of the upper surface of the cover layer 20, it is possible to detect the respective touched positions.

Background art documents about detection circuits of the projection-type electrostatic capacitance type include U.S.

Pat. No. 4,582,955, U.S. Pat. No. 4,686,332, U.S. Pat. No. 4,733,222, U.S. Pat. No. 5,374,787, U.S. Pat. No. 5,543,588, U.S. Pat. No. 7,030,860, and U.S. Patent Application Publication No. 2004/0155871.

Preferable aspects of the electroconductive film according to the present embodiment will be described below.

The metal wires that make up the first terminal interconnects 44a, the second terminal interconnects 44b, the first terminals 50a, the second terminals 50b, the first ground line 48a, the second ground line 48b, the first ground terminal 46a, and the second ground terminal 46b, and the thin metal wires that make up the electrodes 36 are made of a single electroconductive material. The single electroconductive material comprises a metal which is one of silver, copper, and aluminum, or an alloy containing at least one of these metals.

The length of one side of the grids 38 should preferably be in the range of 50-500 µm, and more preferably in the range of 150-300 µm. If the length of one side is smaller than the above lower limit value, then since the electrostatic capacitance at the time of detection is reduced, the possibility of a detection failure becomes high. If the length of one side is greater than the above upper limit value, then the accuracy of positional detection tends to decrease. If the grids 38 fall in the above range, then it is possible to keep the transparency good, so that in a case where the electroconductive film is applied to the display panel 24 of the display device 22, it allows the viewer to visually recognize displayed information without a sense of incongruity.

The line width of the thin metal wires 52 that make up the electrodes 36 is in the range of 1-9 µm. The line width of the first electrodes 36A may be the same as or different from the line width of the second electrodes 36B.

Specifically, the line width of the thin metal wires 52 that make up the electrodes 36 should preferably have a lower limit of 1 µm or greater, or 3 µm or greater, or 4 µm or greater, or 5 µm or greater, and an upper limit of 9 µm or smaller or 8 µm or smaller. If the line width is smaller than the above lower limit value, then since the electroconductivity of the thin metal wires becomes insufficient, they have insufficient detection sensitivity when used on touch screen panels. If the line width exceeds the above upper limit value, then moire becomes distinctive, and visibility becomes poor when used on the touch panel 10. The line width in the above range is effective to improve moire in the first sensor area 26A and the second sensor area 26B, making visibility better in particular. The line interval (the distance between adjacent thin metal wires) should preferably be equal to or greater than 30 µm and equal to or smaller than 500 µm, more preferably be equal to or greater than 50 µm and equal to or smaller than 400 µm, or most preferably be equal to or greater than 100 µm and equal to or smaller than 350 µm. The thin metal wires may include portions where the line width is greater than 200 µm for the purpose of making ground connections.

In terms of visible light transmittance, the aperture ratio of the first electroconductive film 16A and the second electroconductive film 16B according to the present embodiment should preferably be 85% or greater, more preferably 90% or greater, or most preferably 95% or greater. The aperture ratio refers to the ratio of the light-transmitting areas, except the thin metal wires, to the overall film. For example, the aperture ratio of a square grid of thin metal wires having a line width of 6 µm and a fine line pitch of 240 µm is 95%.

In the laminated electroconductive film assembly 18, as shown in FIG. 2, for example, the first electroconductive section 30A is formed on the surface of the first transparent substrate 32A, and the second electroconductive section 30B is formed on the surface of the second transparent substrate 32B. According to another example, as shown in FIG. 7, the first electroconductive section 30A may be formed on the surface of the first transparent substrate 32A, and the second electroconductive section 30B may be disposed on the reverse side of the first transparent substrate 32A. In this case, the second transparent substrate 32B is dispensed with, and the first transparent substrate 32A is stacked on the second electroconductive section 30B whereas the first electroconductive section 30A is stacked on the first transparent substrate 32A. The first transparent adhesive layer 34A is formed in covering relation to the first electroconductive section 30A, and the second transparent adhesive layer 34B is disposed in covering relation to the second electroconductive section 30B. Another layer may be interposed between the first electroconductive film 16A and the second electroconductive film 16B, and the first electroconductive patterns 36A and the second electroconductive patterns 36B may be disposed in facing relation to each other provided they are insulated from each other.

As shown in FIG. 1, first alignment marks 60a and second alignment marks 60b for positioning the first electroconductive film 16A and the second electroconductive film 16B at the time they are to be bonded to each other should preferably be disposed on respective corners, for example, of the first electroconductive film 16A and the second electroconductive film 16B. The first alignment marks 60a and the second alignment marks 60b serve as new composite alignment marks after the first electroconductive film 16A and the second electroconductive film 16B are bonded into the stacked electroconductive film assembly 18. The composite alignment marks also function as alignment marks for positioning the stacked electroconductive film assembly 18 in a case where it is to be placed on the display panel 24.

In the above example, the first electroconductive film 16A and the second electroconductive film 16B are applied to the touch panel 10 of the projection-type electrostatic capacitance type. However, they may be applied to a touch panel of the surface-type electrostatic capacitance type and a touch panel of the resistance film type.

The first electroconductive film 16A and the second electroconductive film 16B according to the present embodiment may be used as an electroconductive film for the touch panel of the display device 22, an electromagnetic-wave shield film of the display device 22, or an optical film on the display panel 24 of the display device 22. The display device 22 may be a liquid crystal display, a plasma display, an organic EL display, an inorganic EL display, or the like.

Methods of manufacturing an electroconductive film 16 as a representative example will briefly be described below. The first transparent substrate 32A and the second transparent substrate 32B will collectively be referred to as a transparent substrate 32.

According to a method for manufacturing the electroconductive film 16, a photosensitive material having an emulsion layer containing a photosensitive silver halide on the transparent substrate 32, for example, is exposed to light and developed. Exposed areas and unexposed areas are made into metallic silver areas and light-transmitting areas, thereby producing electrodes 36.

Figure 8A:
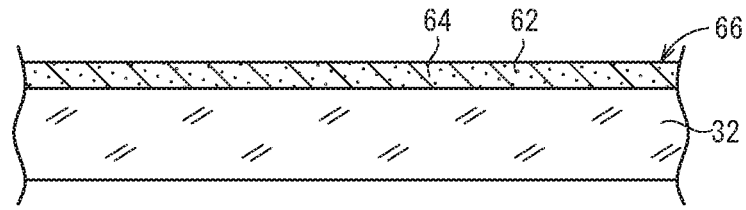
FIGS. 8A through 8D are process views showing a first method of manufacturing an electroconductive film.
Figure 8B:
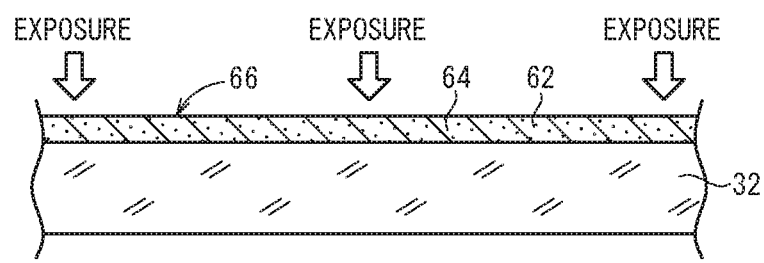
Figure 8C:
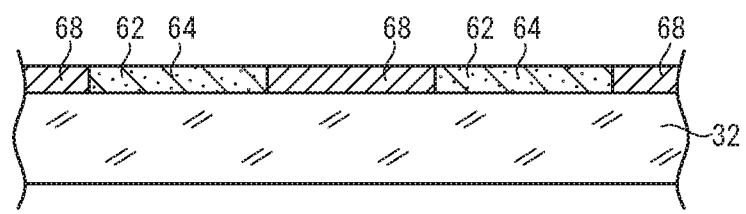

Specifically, as shown in FIG. 8A, the transparent substrate 32 is first coated with a silver-salt photosensitive layer 66 which has been prepared by mixing a silver halide 62 (e.g., silver bromide particles, silver chlorobromide particles, or silver chloroiodobromide particles) with a gelatin 64 which is one type of water-soluble binder, thereby obtaining a photosensitive material. In FIGS. 8A through 8C, though the silver halide 62 is illustrated as particulate matter, it is shown as exaggerated for the purpose of assisting in understanding the present invention, and does not represent size, density, etc.

Thereafter, as shown in FIG. 8B, the silver-salt photosensitive layer 66 is exposed to light that is necessary to form electrodes 36. Specifically, a photomask (not shown) having a mask pattern corresponding to a predetermined mesh pattern is brought into close contact with the silver-salt photosensitive layer 66, and light is applied to the silver-salt photosensitive layer 66, thereby exposing the silver-salt photosensitive layer 66 to the light through the predetermined mesh pattern. In a case where the silver halide 62 is subjected to light energy, it is sensitized and generates minute silver core which cannot be observed by the naked eye, referred to as "latent image".

Thereafter, a development is carried out in order to amplify the latent image into a visible image which can be observed by the naked eye, as shown in FIG. 8C. Specifically, the development is carried out on the silver-salt photosensitive layer 66 on which the latent image has been formed, by a developing liquid (which may be either an alkaline solution or an acid solution, but is usually an alkaline solution). In the development, silver ions supplied from the silver halide particles or the developing liquid are reduced into a metallic silver by a reducing agent referred to as a principal developing agent in the developing liquid, using the latent image silver core as catalytic core, resulting in a visible silver image (developed silver 68) where the latent image silver core have been amplified.

Figure 8D:
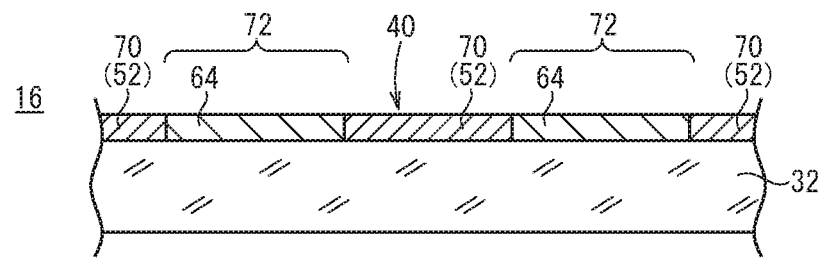

After the development is finished, since the silver halide 62 that is sensitive to light remains in the silver-salt photosensitive layer 66, a fixation treatment is carried out by a fixing liquid (which may be either an acid solution or an alkaline solution, but is usually an acid solution) to remove the silver halide 62, as shown in FIG. 8D.

In a case where the fixation treatment is carried out, thin metal wires 52 are formed of metallic silver areas 70 in the exposed areas, and only the gelatin 64 remains in the unexposed areas (areas which will subsequently become openings 72). At this stage, an electroconductive film 16 is fabricated.

The reaction formula of a fixation treatment which is carried out by thiosulfate with silver bromide used as the silver halide 62 is given as follows:

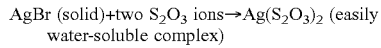

AgBr (solid)+two $S_2O_3$ ions→$Ag(S_2O_3)_2$ (easily water-soluble complex)

Specifically, two thiosulfuric acid ions $S_2O_3$ and silver ions (silver ions from AgBr) in the gelatin 64 generate a silver thiosulfate complex. As the silver thiosulfate complex is highly water-soluble, it is eluted from within the gelatin 64. As a result, the developed silver 68 is fixed and remains as the metallic silver areas 70.

Therefore, the development is a process for causing the reducing agent to react with the latent image to precipitate the developed silver 68, whereas the fixation treatment is a process for eluting the silver halide 62 which has not become the developed silver 68 into water. For details, reference should be made to T. H. James, The Theory of the Photographic Process, 4th ed., Macmillian Publishing Co., Inc, NY. Chapter 15, pp. 438-442, 1977.

Since the development is performed in the alkaline solution in many cases, the alkaline solution applied in the development is carried into the fixation treatment solution (which is an acid solution in many cases) in a case where the development changes to the fixation treatment, resulting in the problem that the activity of the fixation treatment solution varies. After the film has left the development tank, an unintended development reaction may proceed further with the developing liquid that has remained on the film. Consequently, after the development and before the fixation treatment, it is preferable to neutralize or acidify the silver-salt photosensitive layer 66 with a stop solution such as an acetic acid (vinegar) solution or the like.

Furthermore, the metallic silver areas 70 may additionally be physically developed and/or plated, so that an electroconductive metal may be carried onto the metallic silver areas 70, producing thin metal wires 52. An overall layer wherein the electroconductive metal is carried onto the metallic silver areas 70 will be referred to as an electroconductive metal area.

As described above, the silver-salt photosensitive layer 66 is exposed to light and developed to fabricate the electroconductive film 16 which has the mesh pattern 40 where the line width of the thin metal wires 52 is varying. The average line width Wave and line width variations of the thin metal wires 52 can be adjusted by appropriately changing the extent of protrusion and period of concavities and convexities formed on the side walls of the mask pattern.

Alternatively, a photosensitive layer to be plated is formed on the transparent substrate 32 using a pre-plating treatment material, after which it is exposed to light, developed, and then plated. Accordingly, exposed areas and unexposed areas are made into metallic silver areas and light-transmitting areas, thereby producing electrodes 36. Furthermore, the metal areas may additionally be physically developed and/or plated, so that an electroconductive metal may be carried onto the metal areas.

Further examples of preferred procedures of the method using the pre-plating treatment material should include the following two procedures: Specific details of the methods described below are disclosed in Japanese Laid-Open Patent Publication No. 2003-213437, Japanese Laid-Open Patent Publication No. 2006-064923, Japanese Laid-Open Patent Publication No. 2006-058797, and Japanese Laid-Open Patent Publication No. 2006-135271, etc.

(a) A transparent substrate 32 is coated with a layer to be plated containing a plating catalyst or a functional group that will interact with a precursor thereof. Thereafter, the layer to be plated is exposed to light, developed, and then plated to form a metal area on the material to be plated.

(b) A foundation layer containing a polymer and a metal oxide and a layer to be plated containing a plating catalyst or a functional group capable of interacting with a precursor thereof are deposited in the order described on a transparent substrate 32. Thereafter, the layer to be plated is exposed to light, developed, and then plated to form a metal area on the material to be plated.

Figure 9A:
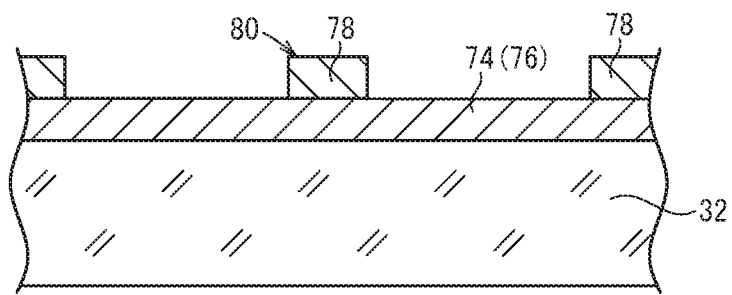
FIGS. 9A and 9B are process views showing a second method of manufacturing an electroconductive film.
Figure 9B:
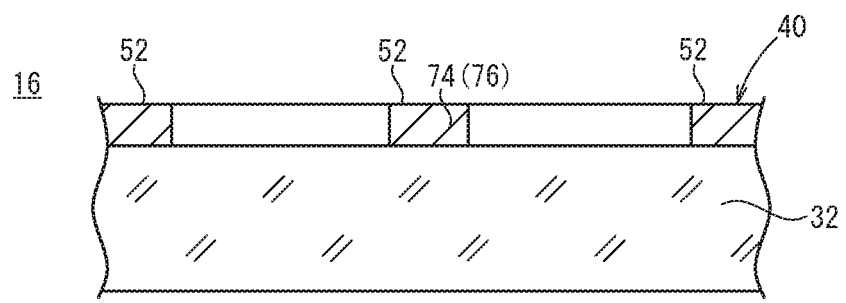

According to another method (second manufacturing method), as shown in FIG. 9A, a photoresist film 78 is disposed on a copper foil 74 formed on a transparent substrate 32 or a silver film 76 formed by sputtering on a transparent substrate 32, exposed to light and developed into a resist pattern 80. Then, as shown in FIG. 9B, the copper foil 74 or the silver film 76 which extends beyond the resist pattern 80 may be etched into a mesh pattern 40 where the line width of thin metal wires 52 is varying. The mask used in exposing the photoresist film 78 may have a mask pattern corresponding to the mesh pattern 40. The average line width Wave and line width variations of the thin metal wires 52 can be adjusted by appropriately changing the extent of protrusion and period of concavities and convexities formed on the side walls of the mask pattern.

Figure 10A:
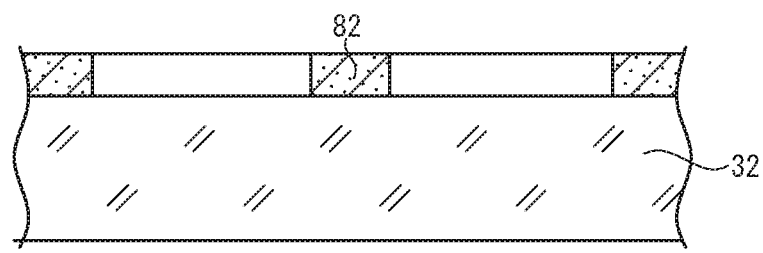
FIGS. 10A and 10B are process views showing a third method of manufacturing an electroconductive film.
Figure 10B:
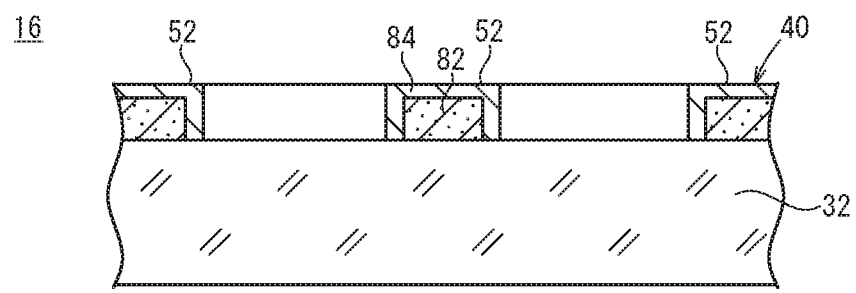

According to a third manufacturing method, as shown in FIG. 10A, a paste 82 containing fine metal particles is formed on a transparent substrate 32 by screen printing or an ink jet. As shown in FIG. 10B, the paste 82 is plated with a metal 84, forming a mesh pattern 40 of thin metal wires 52.

Each of the layers of the electroconductive film 16 will be described in detail below.

[Transparent Substrate Structure 32]

The transparent substrate 32 may be a plastic film, a plastic plate, a glass plate, or the like. The plastic film and the plastic plate may be made of a polyester such as polyethylene terephthalate (PET), polyethylene naphthalate (PEN), or the like, or triacetyl cellulose (TAC) or the like. A plastic film or a plastic plate whose melting point is equal to or lower than about 290° C. is preferable for use as the transparent substrate 32. Particularly, PET is preferable from the standpoint of light transmittance, processability, etc.

[Silver-Salt Photosensitive Layer 66]

The silver-salt photosensitive layer 66 to be made into the metal thin lines 52 of the electrodes 36 contains additives such as a solvent, a dye, etc. other than a silver salt and a binder.

The silver salt used according to the present embodiment includes an inorganic silver salt such as a silver halide or the like and an organic silver salt such as silver acetate or the like. According to the present embodiment, it is preferable to use a silver halide having excellent properties for use as an optical sensor.

<Silver Halide>

The halogen contained in the silver halide may be chlorine, bromine, iodine, or fluorine, or may be a combination of thereof. For example, a silver halide containing AgCl, AgBr, or AgI, as a main component is preferably used, and a silver halide containing AgBr or AgCl as a main component is further preferably used. Silver chlorobromide, silver chloroiodobromide, or silver iodobromide is also preferably used. More preferably, silver chlorobromide, silver bromide, silver chloroiodobromide, or silver iodobromide is used, and most preferably, silver chlorobromide or silver chloroiodobromide which contains 50 mol % or more of silver chloride is used. The "silver halide containing AgBr (silver bromide) as a main component" refers to a silver halide where the mole ratio of bromide ion in the silver halide composition is 50% or greater. The silver halide particles that contain AgBr as a main component may contain iodide ion, chloride ion, etc. other than bromide ion.

The silver halide emulsion layer used in the present embodiment may contain metals belonging to the VIII and VIIB groups. Particularly, in order to obtain four or more gradations and to achieve low fogging, it is preferable to contain a rhodium compound, an iridium compound, a ruthenium compound, an iron compound, an osmium compound, or the like. For higher sensitivity, it is advantageous to dope the silver halide emulsion layer with a hexacyanometal complex such as $K_4[Fe(CN)_6]$, $K_4[Ru(CN)_6]$, or $K_3[Cr(CN)_6]$. The amount of the compound added per 1 mol of silver halide should preferably be in the range of $10^{-10}$ to $10^{-2}$ mol/mol Ag, and more preferably in the range of $10^{-9}$ to $10^{-3}$ mol/mol Ag.

Moreover, according to the present embodiment, a silver halide containing Pd(II) ion and/or Pd metal may also preferably be used. Though Pd may be distributed uniformly in the silver halide particles, it should preferably be contained in the vicinity of the surface layer of the silver halide particles. Pd that is "contained in the vicinity of the surface layer of the silver halide particles" means that the silver halide particle has a layer where the content of palladium is higher within 50 nm in the depthwise direction from the surface of the silver halide particles than in the other layers. Such silver halide particles can be prepared by adding Pd while silver halide particles are being formed. Pd should preferably be added after silver ion and halogen ion have been added by 50% or more of their total amounts to be added. It is also preferable to have Pd(II) ion present in the silver halide surface layer according to a method of adding Pd(II) ion in an after-ripening process or the like. The silver halide particles that contain Pd increase the rate of the physical development and the electroless plating, increase the efficiency of production of a desired heating body, and contribute to a reduction in the cost of production. Pd is well known as an electroless plating catalyst. According to the present invention, since Pd can be localized in the surface layer of the silver halide particles, it is possible to reduce the amount of the extremely expensive Pd.

According to the present embodiment, the content of the Pd ion and/or Pd metal contained in silver halide should preferably be in the range of $10^{-4}$-0.5 mol/molAg, and more preferably in the range of 0.01-0.3 mol/molAg with respect to the mol number of silver of silver halide. Examples of the Pd compound that is used are $PdCl_4$, $Na_2PdCl_4$, etc.

The amount of coated silver (the amount of coated silver salt) of the silver-salt emulsion layer should preferably be in the range of 1-30 g/m², more preferably be in the range of 1-25 g/m², and much more preferably be in the range from 5-20 g/m², calculated in terms of silver. The amount of coated silver in the above range achieves a desired surface resistance when used as an electroconductive film.

<Binder>

The binder used according to the present embodiment includes, for example, gelatin, polyvinyl alcohol (PVA), polyvinyl pyrrolidone (PVP), polysaccharide such as starch or the like, cellulose or its derivative, polyethylene oxide, polyvinylamine, chitosan, polylysine, polyacrylic acid, polyalginic acid, polyhyaluronic acid, carboxycellulose, or the like. These materials have neutral, anionic, and cationic properties due to the ionicity of the functional group.

The amount of the binder contained in the silver-salt photosensitive layer 66 according to the present embodiment is not limited to any particular value, but may be appropriately determined in so far as dispersibility and adhesion are exhibited. The amount of the binder contained in the silver-salt photosensitive layer 66 should preferably be equal to or larger than ¼ in terms of a silver/binder volume ratio, and more preferably equal to or more than ½. The silver/binder volume ratio should preferably be equal to or less than 100/1, and more preferably equal to or less than 50/1. The silver/binder volume ratio should further preferably be in the range of 1/1 to 4/1, and most preferably be in the range of 1/1 to 3/1. The silver/binder volume ratio in the silver-salt photosensitive layer 66 in the above ranges can suppress variations in the resistance value even if the amount of coated silver is adjusted. As a result, it is possible to obtain an electroconductive film 16 having a uniform surface resistance. The silver/binder volume ratio can be determined by converting the amount of silver halide/the amount of binder (weight ratio) of the raw material into the amount of silver/the amount of binder (weight ratio), and further converting the amount of silver/the amount of binder (weight ratio) into the amount of silver/the amount of binder (volume ratio).

<Solvent>

The solvent used to form the silver-salt photosensitive layer 66 is not limited to any particular material, but may be water, an organic solvent (e.g., an alcohol such as methanol or the like, a ketone such as acetone or the like, an amide such as formamide or the like, a sulfoxide such as dimethyl sulfoxide or the like, an ester such as ethyl acetate or the like, or an ether), an ionic liquid, or a solvent as a mixture of these materials. The content of the solvent contained in the silver-salt photosensitive layer 66 according to the present embodiment is in the range of 30-90 weight %, and should preferably be in the range of 50-80 weight %, with respect to the total weight of the silver salt, the binder, etc., contained in the silver-salt photosensitive layer 66.

<Other Additives>

Various additives used according to the present embodiment are not limited to any particular materials. Known additives may preferably be used.

[Electroconductive Metal Areas]

The line width of the electroconductive metal areas (the line width of the thin metal wires 52) according to the present embodiment should preferably have a lower limit of 1 µm or greater, or 3 µm or greater, or 4 µm or greater, or 5 µm or greater, and an upper limit of 10 µm or smaller, 9 µm or smaller, or 8 µm or smaller. If the line width is smaller than the above lower limit value, then since the electroconductivity becomes insufficient, they have insufficient detection sensitivity when applied to the touch panel 10. If the line width exceeds the upper limit value, then moire becomes distinctive, and visibility becomes poor when applied to the touch panel 10. The line width in the above range is effective to improve moire in the electroconductive metal areas, making visibility better in particular. The line interval (the distance between mutually facing sides of the grid 38) should preferably be equal to or greater than 30 µm and equal to or smaller than 500 µm, more preferably be equal to or greater than 50 µm and equal to or smaller than 400 µm, or most preferably be equal to or greater than 100 µm and equal to or smaller than 350 µm. The thin metal wires may include portions where the line width is greater than 200 µm for the purpose of making ground connections, or the like.

In terms of visible light transmittance, the aperture ratio of the electroconductive metal areas according to the present embodiment should preferably be 85% or greater, more preferably 90% or greater, and most preferably 95% or greater. The aperture ratio refers to the ratio of the light-transmitting areas, except the electroconductive areas including the electrodes 36, the terminal interconnects, the terminals, etc. to the overall film. For example, the aperture ratio of a square grid of thin metal wires having a line width of 15 µm and a pitch of 300 µm is 90%.

[Light-Transmitting Area]

The light-transmitting area according to the present embodiment refers to a portion of the electroconductive film 16 which has light transmittance, other than the electroconductive metal areas. The transmittance of the light-transmitting areas as represented by the minimum value of transmittance in the wavelength range of 380-780 nm except the contribution of the transparent substrate 32 to light absorption and reflection is equal to or greater than 90%, more preferably equal to or greater than 95%, much more preferably equal to or greater than 97%, far more preferably equal to or greater than 98%, and most preferably equal to or greater than 99%.

[Electroconductive Film 16]

The thickness of the first transparent substrate 32A of the first electroconductive film 16A and the second transparent substrate 32B of the second electroconductive film 16B should preferably be in the range of 75 to 350 µm, and more preferably in the range of 30-150 µm. The thickness in the range of 75-350 µm allows the electroconductive film 16 to have a desired visible light transmittance and to be handled with ease.

The thickness of the metallic silver areas 70 on the transparent substrate 32 can appropriately be determined depending on the thickness of the coating liquid for the silver-salt photosensitive layer applied to the transparent substrate 32. Though the thickness of the metallic silver areas 70 can be selected from the range of 0.001-0.2 mm, the thickness of the metallic silver areas 70 should preferably be equal to or less than 30 µm, more preferably be equal to or less than 20 µm, much more preferably be in the range of 0.01-9 µm, and most preferably be in the range of 0.05-5 µm. The metallic silver areas 70 should preferably be shaped in a pattern. The metallic silver areas 70 may be in one layer or may be of a multi-layered structure including two or more layers. If the metallic silver areas 70 are shaped in a pattern and of a multi-layered structure including two or more layers, then different color sensitivities can be given to the metallic silver areas 70 for making them sensitive to different wavelengths. The different color sensitivities that are given to the metallic silver areas 70 make it possible to form different patterns in the respective layers in a case where the metallic silver areas 70 are exposed to different exposure wavelengths.

The thickness of the electroconductive metal areas for use in the touch panel 10 should preferably be thinner as it gives a wider angle of view to the display panel 24. The electroconductive metal areas are also required to be thinner for an increased visibility. From these points of view, the thickness of the layer of the electroconductive metal carried onto the electroconductive metal areas should preferably be less than 9 µm, more preferably be equal to or greater than 0.1 µm and less than 5 µm, and much more preferably be equal to or greater than 0.1 µm and less than 3 µm.

According to the present embodiment, metallic silver areas 70 having a desired thickness can be formed by controlling the coated thickness of the silver-salt photosensitive layer 66 to be coated as referred to above, and the thickness of the layer made up of electroconductive metal particles can freely be controlled by the physical development and/or the plating. Therefore, an electroconductive film 16 whose thickness is less than 5 µm or preferably less than 3 µm can easily be formed.

[Other Layer Structure]

A protective layer, not shown, may be provided on the silver-salt emulsion layer, and an undercoat layer, for example, may be provided beneath the silver-salt photosensitive layer 66.

The steps of a method of manufacturing the electroconductive film 16 will be described below.

[Exposure]

The present embodiment includes the formation of the mesh pattern 40 of the electrodes 36 by a printing process. The mesh pattern 40 of the electrodes 36 may be formed by way of exposure to light and development other than the printing process. Specifically, a photosensitive material having the silver-salt photosensitive layer 66 on the surface of the transparent substrate 32 or a photosensitive material coated with a photopolymer for photolithography is exposed to light. The photosensitive material may be exposed to an electromagnetic wave, which may be light such as visible light, an ultraviolet light, or the like, a radiation such as an X-ray or the like, or the like, for example. A light source having a wavelength distribution or a light source having a particular wavelength may be used to expose the photosensitive material. The exposure should preferably be carried out by a process that uses a glass mask having a mask pattern formed on its surface or a pattern exposure process based on laser lithography.

If the glass mask is used for tight contact exposure, then the glass mask should preferably be made of glass that has been surface-treated to roughen its surface (surface-roughening treatment) by providing minute protrusions on the surface of glass or providing grooves in a region of the surface of glass where the mask pattern is not formed. The exposure should preferably be carried out using light having a single wavelength equal to or smaller than 500 nm or light having composite wavelengths including many wavelength components shorter than 500 nm.

[Development]

According to the present embodiment, development is carried out after the silver-salt photosensitive layer 66 is exposed to light. The development process may be an ordinary development process that is performed on silver-salt photographic films, photographic papers, print engraving sheets, emulsion masks for photomasking, etc. The developer used is not limited to a particular developer, but may be a PQ developing solution, an MQ developing solution, an MAA developing solution, or the like. Commercially available developing solutions such as CN-16, CR-56, CP45X, FD-3, and PAPITOL manufactured by FUJIFILM Corporation, or C-41, E-6, RA-4, D-19, D-72, etc. manufactured by Eastman KODAK Company, or developing solutions included in their kits may be used. A lith developer may also be used.

The development according to the present embodiment may include a fixation treatment for removing the silver salt from the unexposed areas to stabilize the photosensitive material. The fixation treatment according to the present embodiment may be a fixation treatment technology that is performed on photographic silver-salt films, photographic papers, print engraving sheets, emulsion masks for photomasking, etc.

In the fixation treatment, the fixing temperature should preferably be about 20° C. to 50° C., and more preferably 25° C. to 45° C. The fixing time should preferably be 5 seconds to 1 minute, and more preferably 7 seconds to 50 seconds. The amount of a fixing solution for replenishment with respect to the amount of photosensitive material to be processed should preferably be 600 ml/m$^2$ or less, more preferably be 500 ml/m$^2$ or less, and particularly preferably be 300 ml/m$^2$ or less.

The photosensitive material which has been developed and fixed should preferably be washed with water and stabilized. In the washing or stabilizing process, the amount of washing water supplied per 1 m$^2$ of the photosensitive material is 20 liters or less, and the amount of washing water for replenishment may be 3 liters or less (including 0 liter for washing the photosensitive material with a pool of water).

The metallic silver included in the exposed areas after the development should preferably be of 50 weight % or more, or more preferably of 80 weight % or more, with respect to the silver contained in the exposure areas prior to exposure. 50 weight % or more of the silver contained in the exposed areas with respect to the silver contained in the exposure areas prior to exposure is preferable in terms of high electric conductivity.

The gradation after the development according to the present embodiment is not limited to any particular values, but should preferably be in excess of 4.0. If the gradation after the development exceeds 4.0, then the electric conductivity of electrically conductive metal areas is increased while keeping high light transmittance of the light-transmitting areas. The gradation can be maintained at 4.0 or higher by doping the photosensitive material with rhodium ion or iridium ion, as described above.

The electroconductive film 16 is produced by the above processes. The surface resistance of the electroconductive film 16 thus obtained should preferably in the range from 0.1 to 100 ohms/sq. The lower limit value should preferably be 1 ohm/sq. or more, 3 ohms/sq. or more, 5 ohms/sq. or more, or 10 ohms/sq. or more. The upper limit value should preferably be 70 ohms/sq. or less, or 50 ohms/sq. or less. After the development, the electroconductive film 16 may be subjected to a calender treatment to adjust the surface resistance thereof to a desired value.

[Physical Development and Plating Process]

According to the present embodiment, in order to increase the electric conductivity of the metallic silver areas produced by the above exposure and development treatments, the metallic silver areas may be physically developed and/or plated to carry electrically conductive metal particles onto the metallic silver areas 70. According to the present invention, the electrically conductive metal particles may be deposited on the metallic silver area 70 only by either the physical development or the plating treatment, or may be disposed on the metallic silver areas 70 by a combination of the physical development and the plating treatment.

The "physical development" according to the present embodiment refers to a process of depositing metal particles on metal or metal compound core by reducing metal ions such as silver ions or the like with a reducing agent. The physical development is applied to instant B & W films, instant slide films, the fabrication of printing plates, etc. The present invention can utilize the technology of physical development. The physical development may be performed at the same time as the development treatment after the exposure or may be performed separately after the development.

According to the present embodiment, the plating treatment may be an electroless plating (chemical reduction plating or displacement plating), an electrolytic plating, or both an electroless plating and an electrolytic plating. The electroless plating according to the present embodiment may be based on a known electroless plating technology, e.g., an electroless plating technology used for printed wiring boards or the like. The electroless plating should preferably be an electroless copper plating.

In the method of manufacturing the electroconductive film 16 according to the present embodiment, the step of plating or the like may not necessarily be carried out. In the method of manufacturing the electroconductive film 16 according to the present embodiment, a desired surface resistance can be obtained by adjusting the amount of coated silver of the silver-salt photosensitive layer 66 and the silver/binder volume ratio. If necessary, a calendering process, etc. may be carried out.

[Oxidization Treatment]

According to the present embodiment, the metallic silver areas 70 after the development treatment and the electroconductive metal areas formed by the physical development and/or the plating treatment should preferably be subjected to an oxidization treatment. The oxidization treatment can remove any metal slightly deposited on the light-transmitting areas, for example, to make the light-transmitting areas have approximately 100% light transmittance.

(Film Hardening Treatment after Development Treatment)

After the development has been carried out on the silver-salt photosensitive layer 66, a film hardening treatment should preferably be carried out by immersing the silver-salt photosensitive layer 66 in a film hardener. The film hardener may be, for example, a dialdehyde such as glutaraldehyde, adipaldehyde, 2,3-hydroxy-1,4-dioxane, or the like, or boric acid as disclosed in Japanese Laid-Open Patent Publication No. 02-141279.

[Calendering Treatment]

The developed metallic silver areas 70 may be smoothed by a calendering treatment for thereby significantly increasing the electroconductivity of the metallic silver areas 70. The calendaring process may be carried out by a calender roll unit, which generally has a pair of rolls.

The rolls that are used in the calendering process may be plastic rolls made of epoxy, polyimide, polyamide, polyimide-amide, or the like or metal rolls. If the metallic silver areas have silver-salt photosensitive layers 66 on both surfaces thereof, then they should be treated with a pair of the metal rolls. If the metallic silver areas have an emulsion layer on one surface thereof, then they may be treated with a combination of metal and plastic rolls for preventing the metallic silver areas from being wrinkled. The upper limit for a line pressure is preferably equal to or higher than 1960 N/cm (200 kgf/cm, or 699.4 kgf/cm² in terms of a surface pressure), more preferably equal to or higher than 2940 N/cm (300 kgf/cm, or 935.8 kgf/cm² in terms of a surface pressure), and up to 6880 N/cm (700 kgf/cm).

A smoothing treatment that is typically carried out by the calender rolls should preferably be performed at a temperature in the range from 10° C. (with no temperature control) to 100° C. A more preferable temperature is approximately in the range from 10° C. (with no temperature control) to 50° C., depending on the line density and shape of the metal mesh pattern 40 and the terminal interconnects and the type of the binder.

The present invention can appropriately be combined with the technologies disclosed in Japanese Laid-Open Patent Publications and WO pamphlets listed in Table 1 and Table 2 below, where the terms "Japanese Laid-Open Patent Publication", "Publication", and "pamphlet" are omitted.

TABLE 1

| | | | | |
|---|---|---|---|---|
| 2004-221564 | 2004-221565 | 2007-200922 | 2006-352073 | 2006-228469 |
| 2007-235115 | 2007-207987 | 2006-012935 | 2006-010795 | 2007-072171 |
| 2006-332459 | 2009-21153 | 2007-226215 | 2006-261315 | 2006-324203 |
| 2007-102200 | 2006-228473 | 2006-269795 | 2006-336090 | 2006-336099 |
| 2006-228478 | 2006-228836 | 2007-009326 | 2007-201378 | 2007-335729 |
| 2006-348351 | 2007-270321 | 2007-270322 | 2007-178915 | 2007-334325 |
| 2007-134439 | 2007-149760 | 2007-208133 | 2007-207883 | 2007-013130 |
| 2007-310091 | 2007-116137 | 2007-088219 | 2008-227351 | 2008-244067 |
| 2005-302508 | 2008-218784 | 2008-227350 | 2008-277676 | 2008-282840 |
| 2008-267814 | 2008-270405 | 2008-277675 | 2008-300720 | 2008-300721 |
| 2008-283029 | 2008-288305 | 2008-288419 | 2009-21334 | 2009-26933 |
| 2009-4213 | 2009-10001 | 2009-16526 | 2008-171568 | 2008-198388 |
| 2008-147507 | 2008-159770 | 2008-159771 | 2008-235224 | 2008-235467 |
| 2008-218096 | 2008-218264 | 2008-224916 | 2008-252046 | 2008-277428 |
| 2008-241987 | 2008-251274 | 2008-252175 | 2007-129205 | |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLE

The present invention will be described more specifically below with respect to Examples according to the present invention. The materials, their amounts used, their ratios, the processing details, and the processing sequences described in the Examples can be changed without departing from the gist of the present invention. Therefore, the scope of the present invention shall not be interpreted as being restricted by the specific example to be described below.

With respect to Examples 1 through 15 and Comparative Examples 1 through 10, the thin metal wires 52 were evaluated for average line widths Wave, line width variations, rates of change of resistance in the bend test, and moire.

The average line width Wave was measured over the length of 5 mm at each of a total of three locations including a location in the vicinity of the center of a fabricated sample and two locations in the vicinity of intermediate areas between the center on a diagonal line and angular portions (corners) thereof, and the measured values were averaged.

The line width variation was determined by:

Line width variation=$\{(W\mathrm{max}-W\mathrm{min})/W\mathrm{ave}\}\times 100$ (%)

where Wmax represents the maximum line width of the thin metal wires 52, Wmin represents the minimum line width of the thin metal wires 52, and Wave represents the average line width.

Example 1

As shown in FIGS. 9A and 9B, a photoresist film 78 was formed on a copper foil 74 having a thickness of 2 μm on the surface of a transparent substrate 32 (made of polyethylene terephthalate (PET) in this example). Thereafter, the photoresist film 78 was exposed to light and developed into a resist pattern 80. The copper foil 74 extending beyond the resist pattern 80 was etched away to form a mesh pattern 40 where the line width of thin metal wires 52 was varying, thereby fabricating an electroconductive film according to Example 1. The thin metal wires 52 of the electroconductive film according to Example 1 had an average line width of 5 μm and a line width variation of 30%.

Example 2

As shown in FIGS. 9A and 9B, silver (Ag) was deposited by sputtering on the surface of a transparent substrate 32 (PET in this example), forming a silver film 76 having a thickness of 2 μm. Thereafter, a photoresist film 78 was formed on the silver film 76, and then was exposed to light and developed into a resist pattern 80. The silver film 76 exposed from the resist pattern 80 was etched away to form a mesh pattern 40 where the line width of thin metal wires 52 was varying. The thin metal wires 52 of the electroconductive film according to Example 2 had an average line width of 5 μm and a line width variation of 30%.

Example 3

(Silver Halide Photosensitive Material)

An emulsion including an aqueous medium, a gelatin, and silver chloroiodobromide particles (I=0.2 mol %, Br=40 mol %) was prepared. 10.0 g of gelatin was contained per 150 g of Ag. The particles have an average spherical equivalent diameter of 0.1 μm.

To the emulsion were added $K_3Rh_2Br_9$ and $K_2IrCl_6$ at a concentration of $10^{-7}$ (mol/mol-silver), to dope the silver bromide particles with Rh ions and Ir ions. $Na_2PdCl_4$ was further added to the emulsion, and the emulsion was sensitized with gold and sulfur using chloroauric acid and sodium thiosulfate. The emulsion thus processed was referred to as an emulsion A. An emulsion whose sensitivity was doubled was prepared by reducing the amount of $K_3Rh_2Br_9$ added to the emulsion A, and the emulsion thus prepared was referred to as an emulsion B.

(Coating with Photosensitive Layer)

Thereafter, the surface of the transparent substrate 32 (PET in this example) was coated with silver of 10 g/m$^2$ together with a gelatin hardener. The Ag/gelatin volume ratio was 2/1. The thickness of the transparent substrate 32 was 100 μm. The transparent substrate 32 was then coated with the emulsion B of 5 g/m$^2$ as a lower layer and with the emulsion A of 5 g/m$^2$ as an upper layer, to obtain a photosensitive silver halide material whose photosensitive layer had a thickness of 1.5 μm.

(Exposure)

A photomask having a mask pattern corresponding to the mesh pattern 40 was held in intimate contact with the completed photosensitive silver halide material, and exposed to parallel light emitted from a high-pressure mercury lamp as a light source.

(Development Treatment)

Formulation of 1 L of the developer:

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | controlled at 10.3 |

Formula of 1 L of fixer:

| | |
|---|---|
| Ammonium thiosulfate Solution (75%) | 300 ml |
| Ammonium sulfitemonohydrate | 25 g |
| 1,3-diaminopropanetetraacetic acid | 8 g |
| Acetic acid | 5 g |
| Aqueous ammonia (27%) | 1 g |
| pH | controlled at 6.2 |

Using the above development treatment agents, the exposed photosensitive material was treated for development by automatic developing machine FG-710PTS manufactured by FUJIFILM Corporation under the processing conditions: developed at 35° C. for 30 seconds, fixed at 34° C. for 23 seconds, and washed with flowing water at a rate of 5 L/min. for 20 seconds, to obtain an electroconductive film according to Example 3. The thin metal wires 52 of the electroconductive film according to Example 3 had an average line width of 7 μm and a line width variation of 30%.

Example 4

An electroconductive film was fabricated in the same manner as with Example 3 except that the average line width of the thin metal wires 52 was 6 μm.

Example 5

An electroconductive film was fabricated in the same manner as with Example 3 except that the average line width of the thin metal wires 52 was 5 μm and the line width variation thereof was 20%.

Example 6

An electroconductive film was fabricated in the same manner as with Example 3 except that the average line width of the thin metal wires 52 was 5 μm and the line width variation thereof was 25%.

Example 7

An electroconductive film was fabricated in the same manner as with Example 3 except that the average line width of the thin metal wires 52 was 5 μm.

Example 8

An electroconductive film was fabricated in the same manner as with Example 3 except that the average line width of the thin metal wires 52 was 5 μm and the line width variation thereof was 60%.

Example 9

An electroconductive film was fabricated in the same manner as with Example 3 except that the average line width of the thin metal wires 52 was 4 μm and the line width variation thereof was 20%.

Example 10

An electroconductive film was fabricated in the same manner as with Example 3 except that the average line width of the thin metal wires 52 was 4 μm.

Example 11

An electroconductive film was fabricated in the same manner as with Example 3 except that the average line width of the thin metal wires 52 was 4 μm and the line width variation thereof was 60%.

Example 12

An electroconductive film was fabricated in the same manner as with Example 3 except that the average line width of the thin metal wires 52 was 3 μm and the line width variation thereof was 20%.

Example 13

An electroconductive film was fabricated in the same manner as with Example 3 except that the average line width of the thin metal wires 52 was 3 μm.

Example 14

An electroconductive film was fabricated in the same manner as with Example 3 except that the average line width of the thin metal wires 52 was 3 μm and the line width variation thereof was 60%.

Example 15

An electroconductive film was fabricated in the same manner as with Example 3 except that the average line width of the thin metal wires 52 was 2 μm.

Comparative Example 1

An electroconductive film was fabricated in the same manner as with Example 1 except that the average line width of the thin metal wires 52 was 20 μm and the line width variation thereof was 20%.

Comparative Example 2

An electroconductive film was fabricated in the same manner as with Example 1 except that the average line width of the thin metal wires 52 was 10 μm and the line width variation thereof was 20%.

Comparative Example 3

An electroconductive film was fabricated in the same manner as with Example 1 except that the average line width of the thin metal wires 52 was 10 μm.

Comparative Example 4

An electroconductive film was fabricated in the same manner as with Example 1 except that the average line width of the thin metal wires 52 was 10 μm and the line width variation thereof was 75%.

Comparative Example 5

An electroconductive film was fabricated in the same manner as with Example 3 except that the average line width of the thin metal wires 52 was 10 μm.

Comparative Example 6

An electroconductive film was fabricated in the same manner as with Example 3 except that the average line width of the thin metal wires 52 was 5 μm and the line width variation thereof was 15%.

Comparative Example 7

An electroconductive film was fabricated in the same manner as with Example 3 except that the average line width of the thin metal wires 52 was 5 μm and the line width variation thereof was 75%.

Comparative Example 8

An electroconductive film was fabricated in the same manner as with Example 3 except that the average line width of the thin metal wires 52 was 4 μm and the line width variation thereof was 75%.

Comparative Example 9

An electroconductive film was fabricated in the same manner as with Example 3 except that the average line width of the thin metal wires 52 was 3 μm and the line width variation thereof was 75%.

Comparative Example 10

An electroconductive film was fabricated in the same manner as with Example 3 except that the average line width of the thin metal wires 52 was 2 μm and the line width variation thereof was 75%.

[Evaluation]
(Rate of Change of Resistance by Bend Test)

The surface resistance R1 of the electrodes 36 prior to the above bend test (see FIG. 5) and the surface resistance R2 of the electrodes 36 after the bend test was conducted were determined, and a rate of change of resistance R2/R1 was determined.

Those examples whose rate of change of resistance was greater than 10 were evaluated as "N", those examples whose rate of change of resistance was greater than 4 but equal to or smaller than 10 were evaluated as "B", and those examples whose rate of change of resistance was equal to or smaller than 4 were evaluated as "A".

(Moire)

After the electroconductive film of each of Examples 1 through 15 and Comparative Examples 1 through 10 was applied to the display panel 24 of the display device 22, the display device 22 was installed on a turntable, and the display device 22 was energized to display white color. Then, the turntable is turned between bias angles in the range of −20° to +20°, and moire was visually observed and evaluated.

Moire was evaluated at an observation distanced of 0.5 m from the display screen 24a of the display device 22. When no moire was visible, the result was represented by A. When moire was slightly visibly to an acceptable extent, the result was represented by B. When moire was highly visible, the result was represented by C.

As comprehensive assessment points, level 1 was given when there was no angular range for A and an angular range for C was equal to or greater than 30°, level 2 was given when there was no angular range for A and an angular range for C was smaller than 30°. Level 3 was given when there was no angular range for A and an angular range for C was equal to or smaller than 10°, and level 4 was given when there was no angular range for A and an angular range for B was equal to or greater than 30°. Level 5 was given when an angular range for A was equal to or greater than 10° and smaller than 20°, level 6 was given when an angular range for A was equal to or greater than 20° and smaller than 30°, and level 7 was given when an angular range for A was equal to or greater than 30°.

The range of levels 1-2 was evaluated as "N", level 3 was evaluated as "B", and the range of levels 4-7 was evaluated as "A".

(Evaluation Results)

The evaluation results of Examples 1 through 15 and Comparative Examples 1 through 10 are shown in Table 3 below.

TABLE 3

| | Average line width (μm) | Line width variation (%) | Rate of change of resistance | Moire |
|---|---|---|---|---|
| Comparative Example 1 | 20 | 20 | 5.3:B | 1:N |
| Comparative Example 2 | 10 | 20 | 8.6:B | 2:N |
| Comparative Example 3 | 10 | 30 | 8.5:B | 2:N |
| Comparative Example 4 | 10 | 75 | 9.2:B | 2:N |
| Example 1 | 5 | 30 | 7.9:B | 5:A |
| Example 2 | 5 | 30 | 4.8:B | 5:A |
| Comparative Example 5 | 10 | 30 | 1.02:A | 2:N |
| Example 3 | 7 | 30 | 1.05:A | 3:B |

TABLE 3-continued

|  | Average line width (μm) | Line width variation (%) | Rate of change of resistance | Moire |
|---|---|---|---|---|
| Example 4 | 6 | 30 | 1.8:A | 5:A |
| Comparative Example 6 | 5 | 15 | 1.3:A | 2:N |
| Example 5 | 5 | 20 | 1.2:A | 4:A |
| Example 6 | 5 | 25 | 1.4:A | 5:A |
| Example 7 | 5 | 30 | 1.5:A | 5:A |
| Example 8 | 5 | 60 | 3.3:A | 6:A |
| Comparative Example 7 | 5 | 75 | 11.5:N | 7:A |
| Example 9 | 4 | 20 | 1.8:A | 5:A |
| Example 10 | 4 | 30 | 2.0:A | 5:A |
| Example 11 | 4 | 60 | 3.1:A | 7:A |
| Comparative Example 8 | 4 | 75 | 12.0:N | 7:A |
| Example 12 | 3 | 20 | 2.0:A | 6:A |
| Example 13 | 3 | 30 | 2.5:A | 6:A |
| Example 14 | 3 | 60 | 3.8:A | 7:A |
| Comparative Example 9 | 3 | 75 | 15.0:N | 7:A |
| Example 15 | 2 | 30 | 8.0:B | 6:A |
| Comparative Example 10 | 2 | 75 | 20.0:N | 7:A |

It can be seen from Table 3 that the rates of change of resistance and the moire of Examples 1 through 15 whose average line widths were equal to or smaller than 7 μm and line width variations were equal to or greater than 20% and smaller than 75% were evaluated as "B" or higher, and hence good. In particular, it can be understood that Examples 4 through 14 whose average line widths were 2-6 μm, among Examples 3 through 15 which used the silver-salt photosensitive layer 66, had their rates of change of resistance and moire both evaluated as "A" and had well balanced characteristics.

On the other hand, the moire of Comparative Examples 1 through 5 whose average line widths were greater than 7 μm was evaluated as "N". The rate of change of resistance of Comparative example 6 whose line width variation was equal to or smaller than 20% though its average line width was equal to or smaller than 7 μm was evaluated as "N". The rates of change of resistance of Comparative examples 7 through 10 whose line width variations were equal to or greater than 75% though their average line widths were equal to or smaller than 7 μm were evaluated as "N".

Therefore, it will be seen that the average line width of the thin metal wires 52 should preferably be equal to or greater than 1 μm and equal to or smaller than 7 μm, and the line width variations thereof should preferably be equal to or greater than 20% and equal to or smaller than 75%. The average line width should further preferably be equal to or greater than 2 μm and equal to or smaller than 7 μm, and more preferably be equal to or greater than 2 μm and equal to or smaller than 5 μm.

The electroconductive film and the method of manufacturing same according to the present invention are not limited to the above embodiments, but may incorporate various arrangements without departing from the scope of the invention.

What is claimed is:

1. An electroconductive film comprising an insulating substrate and an electrode made up of thin metal wires disposed on a surface of the insulating substrate, wherein the thin metal wires have varying line widths, a difference between maximum and minimum values of the line widths is equal to or greater than 20% and smaller than 75% of an average line width of the thin metal wires, and the average line width is equal to or greater than 1 μm and equal to or smaller than 7 μm, wherein the electroconductive film satisfies $R2/R1<10$ where a surface resistance of the electrode before a bend test is denoted by $R1$ and a surface resistance of the electrode after the bend test is denoted by $R2$, wherein in the bend test, the electroconductive film is trained around a roller having a diameter of 4 mm which is rotatably mounted on a base, and a process of rotating the roller while one end of the electroconductive film is being pulled under a tension of 28.6 kg per width of 1 m, to bend the electroconductive film, and a process of rotating the roller while another end of the electroconductive film is being pulled under a tension of 28.6 kg per width of 1 m, to bend the electroconductive film, are repeated to bend the electroconductive film 100 times.

2. An electroconductive film according to claim 1, wherein the average line width is equal to or greater than 2 μm and equal to or smaller than 7 μm.

3. An electroconductive film according to claim 1, wherein the average line width is equal to or greater than 2 μm and equal to or smaller than 5 μm.

4. An electroconductive film according to claim 1, wherein the electrode has a mesh pattern made of the thin metal wires.

5. An electroconductive film according to claim 4, wherein if one of the thin metal wires of the mesh pattern is broken, a change in the electric resistance of the electrode is equal to or smaller than 5%.

6. An electroconductive film according to claim 1, wherein the electroconductive film satisfies $R2/R1 \leq 4$.

7. An electroconductive film according to claim 1, wherein the electrode made up of the thin metal wires is disposed on a face side of the insulating substrate, and another electrode made up of thin metal wires is disposed on a reverse side of the insulating substrate.

* * * * *